(12) United States Patent
Lin et al.

(10) Patent No.: US 9,081,275 B2
(45) Date of Patent: Jul. 14, 2015

(54) PHOTOSENSITIVE COMPOSITION AND PHOTORESIST

(71) Applicant: INDUSTRIAL TECHNOLOGY RESEARCH INSTITUTE, Hsinchu (TW)

(72) Inventors: Hsien-Kuang Lin, Hsinchu (TW); Jauder Jeng, Taichung (TW); Sue-May Chen, Taipei (TW); Te-Yi Chang, Bade (TW); Tsung-Yi Chou, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 153 days.

(21) Appl. No.: 13/741,450

(22) Filed: Jan. 15, 2013

(65) Prior Publication Data
US 2013/0137042 A1 May 30, 2013

Related U.S. Application Data

(63) Continuation-in-part of application No. 13/157,008, filed on Jun. 9, 2011, now abandoned.

(30) Foreign Application Priority Data

Dec. 2, 2010 (TW) .............................. 99141978 A

(51) Int. Cl.
| G03F 7/004 | (2006.01) |
| G03F 7/028 | (2006.01) |
| G03F 7/032 | (2006.01) |
| G03F 7/033 | (2006.01) |

(52) U.S. Cl.
CPC ............... *G03F 7/004* (2013.01); *G03F 7/028* (2013.01); *G03F 7/032* (2013.01); *G03F 7/033* (2013.01)

(58) Field of Classification Search
CPC ......... G03F 7/00; G03F 7/0045; G03F 7/027; G03F 7/028; G03F 7/029; G03F 7/032; G03F 7/033; C08F 8/00; C08F 255/00; C08F 283/00; C08F 22/28
USPC .............................................. 430/270.1, 910
See application file for complete search history.

(56) References Cited

U.S. PATENT DOCUMENTS

| 5,234,789 A | 8/1993 | Favier, Jr. et al. |
| 6,432,600 B2 | 8/2002 | Suwa et al. |
| 6,846,606 B1 | 1/2005 | Laney et al. |
| 6,964,813 B2 | 11/2005 | Hashimoto |
| 7,723,461 B1 * | 5/2010 | Wagener et al. .............. 528/354 |
| 2003/0235785 A1 | 12/2003 | Barclay et al. |
| 2004/0063025 A1 * | 4/2004 | Natori et al. ............... 430/270.1 |
| 2007/0214987 A1 | 9/2007 | Sonokawa et al. |
| 2009/0220753 A1 | 9/2009 | Sugasaki |

FOREIGN PATENT DOCUMENTS

JP 2011032301 A * 2/2011

OTHER PUBLICATIONS

Machine translation JP 2011-032301 Feb. 17, 2011.*
Wallach, J.A., et al.; "Copolymers of Itaconic Anhydride and Methacrylate-Terminated Poly(lactic Acid) Macromonomers;" American Chemical Society: Biomacromolecules; 2000; pp. 174-179.
TW Office Action dated Aug. 8, 2013.

* cited by examiner

*Primary Examiner* — Cynthia H Kelly
*Assistant Examiner* — Alyssa L Cepluch
(74) *Attorney, Agent, or Firm* — McClure, Qualey & Rodack, LLP

(57) ABSTRACT

A photosensitive composition and a photoresist are provided. The photoresist is formed by compounding a photosensitive composition. The photosensitive composition comprises a binder agent, a photomonomer and a photoinitiator. The binder agent has a chemical structure comprising following repeating unit:

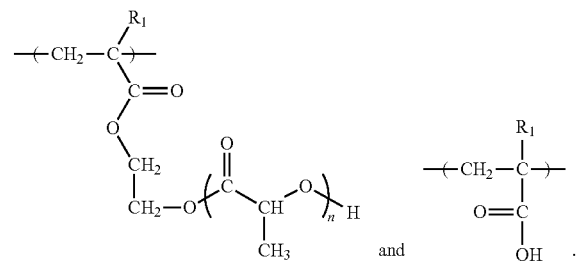

$R_1$ is H or $CH_3$, n is 2-40 of integer. The photomonomer has an amount of about 25-95 parts by weight relative to 100 parts by weight of a solid content of the binder agent. The photo initiator has an amount of about 0.5-15 parts by weight relative to 100 parts by weight of the solid content of the binder agent.

12 Claims, No Drawings

PHOTOSENSITIVE COMPOSITION AND PHOTORESIST

This is a continuation-in-part application of U.S. application Ser. No. 13/157,008, filed Jun. 9, 2011, which claims the benefit of Taiwan application Serial No. 99141978, filed Dec. 2, 2010, the subject matter of which is incorporated herein by reference.

TECHNICAL FIELD

The disclosure relates in general to a photosensitive composition and a photoresist, and more particularly to a photosensitive composition and a photoresist manufactured from a biomass material.

BACKGROUND

For electronic industry, a lithography process such as a printed circuit board process uses a great quantity of photoresist. The conventional photoresist is wholly and mainly manufactured from petroleum chemicals such as an acrylate material. After the photoresist is used in a photoresist process such as a developing process, a stripping process, etc., it becomes a waste product. There are several kilotons of this kind of the waste product. In addition, the waste product is mostly settled by a burying method or an incinerating method, etc. Therefore, the photoresist consumes a great quantity of petroleum material and has bad effect to nature environment.

SUMMARY

A photosensitive composition and a photoresist are provided. The photosensitive composition and the photoresist are formed mainly by using a biomass material that is biodegradable, and thus renewable and not burdens for nature environment.

A photosensitive composition is provided. The photosensitive composition comprises a binder agent, a photomonomer and a photoinitiator. The binder agent has a chemical structure comprising the following repeating unit:

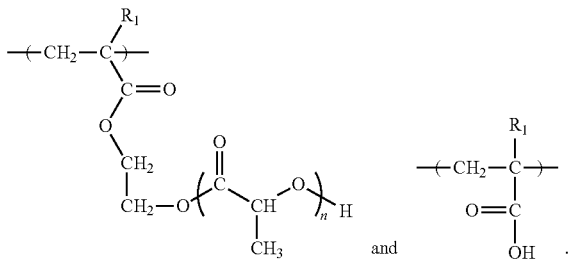

$R_1$ is H or $CH_3$, n is an integer from 2-40. The photomonomer has an amount of about 25-95 parts by weight relative to 100 parts by weight of a solid content of the binder agent. The photoinitiator has an amount of about 0.5-15 parts by weight relative to 100 parts by weight of the solid content of the binder agent.

A photosensitive composition is provided. The photosensitive composition comprises a binder agent, a photomonomer and a photoinitiator. The binder agent has a chemical structure comprising the following repeating units:

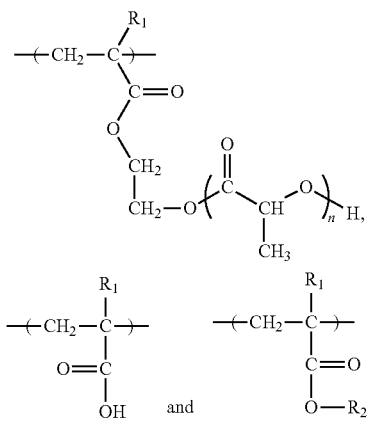

$R_1$ is H or $CH_3$, $R_2$ is an alkyl group with a number of carbons from 1 to 4. n is an integer from 2-40. The photomonomer has an amount of about 25-95 parts by weight relative to 100 parts by weight of a solid content of the binder agent. The photoinitiator has an amount of about 0.5-15 parts by weight relative to 100 parts by weight of the solid content of the binder agent.

A photosensitive composition is provided. The photosensitive composition comprises a binder agent, a photomonomer and a photoinitiator. The binder agent has a chemical structure comprising the following repeating units:

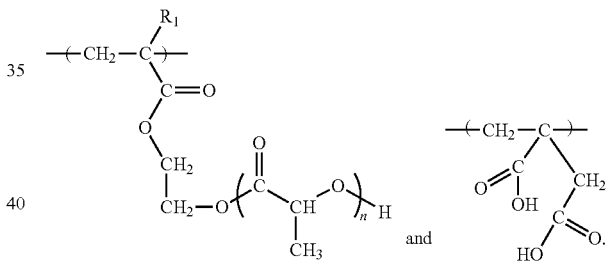

$R_1$ is H or $CH_3$. n is an integer from 2-40. The photomonomer has an amount of about 25-95 parts by weight relative to 100 parts by weight of a solid content of the binder agent. The photoinitiator has an amount of about 0.5-15 parts by weight relative to 100 parts by weight of the solid content of the binder agent.

A photosensitive composition is provided. The photosensitive composition comprises a binder agent, a photomonomer and a photoinitiator. The binder agent has a chemical structure comprising the following repeating units:

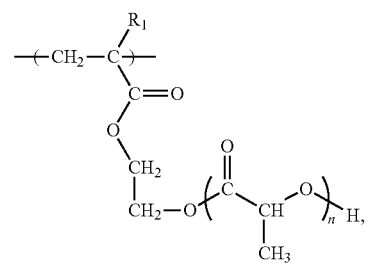

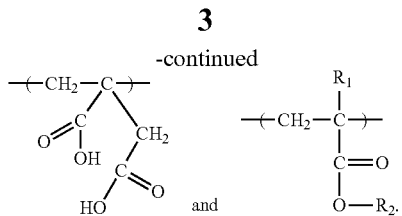

and

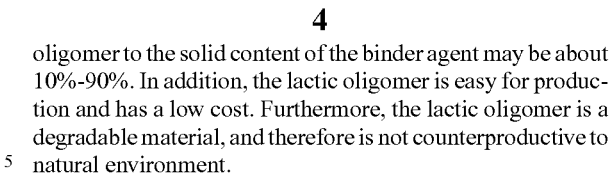

$R_1$ is H or $CH_3$. $R_2$ is an alkyl group with a number of carbons from 1 to 4. n is an integer from 2-40. The photomonomer has an amount of about 25-95 parts by weight relative to 100 parts by weight of a solid content of the binder agent. The photoinitiator has an amount of about 0.5-15 parts by weight relative to 100 parts by weight of the solid content of the binder agent.

A photosensitive composition is provided. The photosensitive composition comprises a binder agent, a photomonomer and a photoinitiator. The binder agent has a chemical structure comprising the following repeating units:

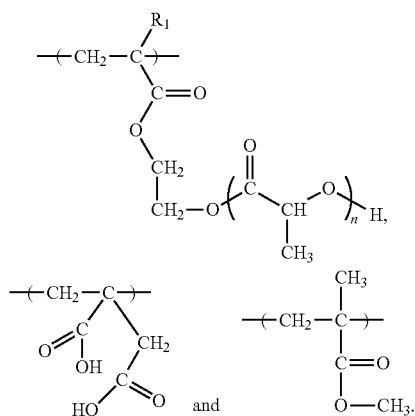

$R_1$ is H or $CH_3$. n is an integer from 2-40. The photomonomer has an amount of about 25-95 parts by weight relative to 100 parts by weight of a solid content of the binder agent. The photoinitiator has an amount of about 0.5-15 parts by weight relative to 100 parts by weight of the solid content of the binder agent.

A photoresist is also provided. The photoresist is formed by compounding the photosensitive composition.

The following description is made with reference to the accompanying drawings.

DETAILED DESCRIPTION

In embodiments, a photosensitive composition comprises a binder agent, a photomonomer, and a photoinitiator. The binder agent is formed by polymerizing a binder composition. The polymerization method comprises a thermal polymerization or a solution polymerization method.

In embodiments, the photosensitive composition is compounded for forming a negative photoresist. The photoresist has a high acid-resistivity, a high glass transition temperature (Tg), and is biodegradable.

The binder composition comprises a lactic oligomer. The binder composition may further comprise a carboxyl group-containing unsaturated compound, carboxyl group-free unsaturated monomer, or a solvent.

The lactic oligomer is manufactured from mainly a lactic material that belongs to a renewable biomass material and is easy to get. In one embodiment, the weight ratio of the lactic oligomer to the solid content of the binder agent may be about 10%-90%. In addition, the lactic oligomer is easy for production and has a low cost. Furthermore, the lactic oligomer is a degradable material, and therefore is not counterproductive to natural environment.

The carboxyl group-containing unsaturated compound comprises, for example, acrylic acid, methyl acrylic acid, cis-butenedioic acid, trans-butenedioic acid, or itaconic acid, etc. In one embodiment, the weight ratio of the carboxyl group-containing unsaturated compound to the solid content of the binder agent may be about 5%-45%. The itaconic acid having an unsaturated double bond could be manufactured by a fermentation process. The itaconic acid is a renewable biomass material. In addition, the itaconic acid has a low prime cost.

The carboxyl group-free unsaturated monomer comprises acrylate monomer such as methyl acrylate, methyl methacrylate, ethyl acrylate, ethyl methacrylate, propyl acrylate, propyl methacrylate, isopropyl acrylate, isopropyl methacrylate, butyl acrylate, butyl methacrylate, isobutyl acrylate, isobutyl methacrylate, hexyl acrylate, hexyl methacrylate, etc., and may comprise other unsaturated monomers such as acrylamide, acrylonitrile, or styrene, etc. In some embodiments, the weight ratio of the carboxyl group-free unsaturated monomer to the solid content of the binder agent may be about 0.1%-85%. However, the present disclosure is not limited thereto. In other embodiments, the carboxyl group-free unsaturated monomer may be not added.

In some embodiments, the binder composition uses carboxyl group containing monomer, such as acrylic acid or methyl acrylate. Therefore, the photosensitive composition conforms to a requirement for a liquid alkali developing. In addition, the hydrophilicity can be improved. The kind and quantity of the carboxyl group-free unsaturated monomer can be adjusted for adjusting the hydrophilicity and the glass transition temperature (Tg) of the binder agent according to an actual condition. The rise of the hydrophilicity of the binder agent can improve the homogeneity to water and the developing property of the whole photosensitive composition, but decrease the adhesive strength of the binder agent. The Tg of the binder agent affects the viscidity of the pre-baked photosensitive composition. The low Tg would result in the wet and sticky photosensitive layer (or photoresist), disadvantaging operation of an image transfer process.

In some embodiments, the binder agent is synthesized by a solution polymerization method. For example, a suitable solvent comprises dichloromethane, chloroform, tetrachloromethane, acetone, methyl ethyl ketone, ethyl alcohol, propyl alcohol, isopropyl alcohol, butyl alcohol, diethyl ketone, propylglycol monomethylether, or propyleneglycol monomethyl ether acetate, etc. In one embodiment, the solvent may have an amount of about 40-200 parts by weight relative to 100 parts by weight of the solid content of the binder agent. If the quantity of solvent is less than the lower limit, the photosensitive solution would have over-high viscosity, and therefore it would be difficult to coat the photosensitive solution. The initiator for the thermal polymerization affects the reaction temperature. As the reaction temperature is higher than the boiling point of the solvent, the polymerization is preceded under a pressurized condition. Otherwise, the solvent would evaporate during the reaction. The polymerization temperature is usually about 50° C.-130° C. In some embodiments, more than two kinds of the solvent can be used for the polymerization according to the solubility of the binder agent.

In some embodiments, the binder agent may have a repeating unit of:

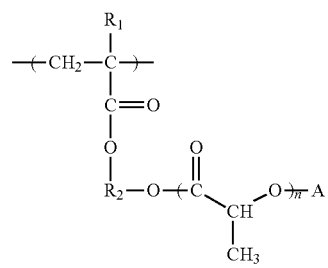

$R^1$ is H or $CH_3$. $R_2$ is $C_2$-$C_4$ alkyl group. n is an integer from 2-40. A is H or

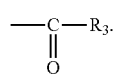

$R_3$ is $C_1$-$C_8$ alkyl group.

In one embodiment, the binder agent has a chemical structure comprising the following repeating units:

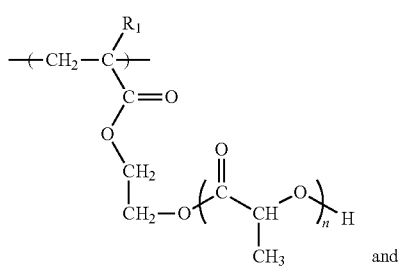

$R_1$ is H or $CH_3$, n is an integer from 2-40.

In one embodiment, the binder agent has a chemical structure comprising the following repeating units:

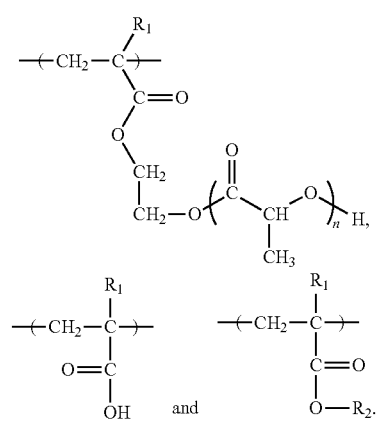

$R_1$ is H or $CH_3$. $R_2$ is an alkyl group with a number of carbons from 1 to 4. n is an integer from 2-40 2-40.

In one embodiment, the binder agent has a chemical structure comprising the following repeating units:

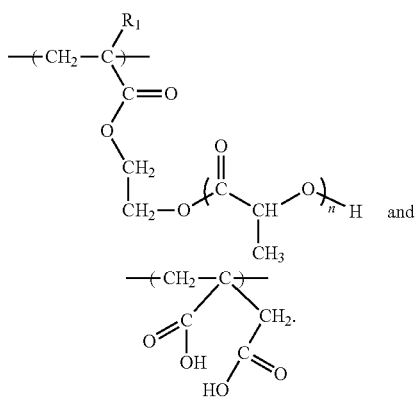

$R_1$ is H or $CH_3$. n is an integer from 2-40.

In one embodiment, the binder agent has a chemical structure comprising the following repeating units:

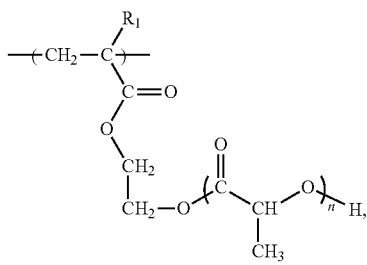
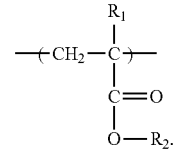

$R_1$ is H or $CH_3$. $R_2$ is an alkyl group with a number of carbons from 1 to 4. n is an integer from 2-40.

In one embodiment, the binder agent has a chemical structure comprising the following repeating units:

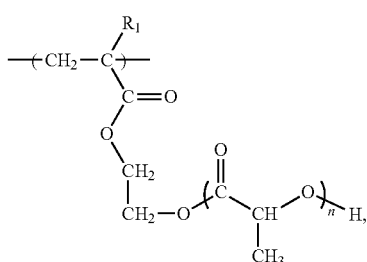
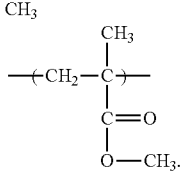

$R_1$ is H or $CH_3$. n is an integer from 2-40.

For example, in one embodiment, the binder agent has the repeating unit of:

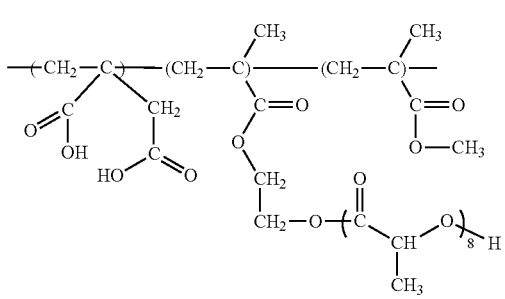

The photomonomer may comprise a photomonomer having less than 5 unsaturated functional groups or a photomonomer having unsaturated functional groups number of which is bigger than or equal to 5. In one embodiment, the photomonomer may have an amount of about 25-95 parts by weight relative to 100 parts by weight of a solid content of the binder agent The photomonomer having less than 5 unsaturated functional groups has high mobility. Therefore, the polymerization can be speeded under an UV exposure for increasing the photosensitivity. The photomonomer having less than 5 unsaturated functional groups may have an amount of about 10-70 parts by weight relative to 100 parts by weight of the solid content of the binder agent. Using the proper quantity can prevent the photosensitive composition from being over stiff. The over-stiff photosensitive composition would disadvantage the proceeding of the polymerization process. The photomonomer having less than 5 unsaturated functional groups of over 70 parts by weight would cause the surface of the photosensitive composition wet and sticky. For example, the photomonomer having less than 5 unsaturated functional groups comprise hexanediol diacrylate, tetraethyleneglycol diacrylate, tripropyleneglycol diacrylate, trimethylolpropane triacrylate, ethoxylated trimethylolpropane triacrylate, trimethylolpropane trimethacrylate, ethoxylated trimethylolpropane trimethacrylate, pentaerythritol triacrylate, pentaerythritol trimethacrylate, pentaerythritol tetraacrylate, or pentaerythritol tetramethacrylate, etc.

The photomonomer having unsaturated functional groups number of which is bigger than or equal to 5 can provide a high amount of double bonds in the photosensitive composition during an UV exposure for facilitating the polymerization. The photosensitive composition would have a high degree of crosslink as the amount of the unsaturated double bond of each molecule of the photomonomer having unsaturated functional groups number of which is bigger than or equal to 5 is big. Therefore, the photoresist could resist etching from an etching solution or an electroplating solution easily. For example, the photomonomer having unsaturated functional groups number of which is bigger than or equal to 5 comprises dipentaerythritol pentaacrylate, dipentaerythritol hexaacrylate, or aromatic urethane hexaacrylate, etc. In some embodiments, the photomonomer having unsaturated functional groups number of which is bigger than or equal to 5 may have an amount of about 0.1-40 parts by weight relative to 100 parts by weight of the solid content of the binder agent. However, the present disclosure is not limited thereto. In other embodiments, the photomonomer having unsaturated functional groups number of which is bigger than or equal to 5 may not be added. Choosing a proper addition quantity could prevent the crosslink and the adhesive strength from being low. The amount of over 40 parts by weight would result in the over-stiff photosensitive layer (or photoresist), not easily stripped by a stripping solution. Thus the operation of the image transfer process is retarded.

For example, the photoinitiator comprises benzil dimethyl ketal, 2,4-diethylthioxanthone, isopropylthioxanthone, 2-methyl-1-(4-(methylthio)phenyl)-2-morpholinopropanone-1 or benzophenone, 2-Dimethylaminoethyl benzoate, Irgacure 369 (Ciba Specialty Chemicals, Pufeng industrial Co., td), 4,4'-bis(N,N-dimethylamino)benzophenone (Michler's ketone), etc. The photoinitiator may have an amount of about 0.5-15 parts by weight relative to 100 parts by weight of the solid content of the binder agent. The photoinitiator having strong photodegradation ability should be selected for avoiding decreasing the degree of crosslink of the surface due to oxygen inhibition. In some embodiments, the photosensitive composition may use the photoinitiator together with a sensitizer for increasing the photosensitivity. For example, the sensitizer comprise 2-dimethyl aminoethyl benzoate, ethyl (p-dimethylamino)benzoate or 4,4'-bis(N,N-dimethylamino)benzophenone (Michler's ketone), etc. The sensitizer may have an amount of about 0.1-5 parts by weight relative to 100 parts by weight of the solid content of the binder agent. However, the present disclosure is not limited thereto. In other embodiments, the sensitizer is not added.

In other embodiments, the photosensitive composition may further comprise a plasticizer. The plasticizer may be a compound having a low molecular weight and a high boiling point. The plasticizer could be diffused into and swell a resin of a micro-structure. The plasticizer can be used for softening the photosensitive composition for promoting the photo-curing process. The plasticizer may comprise a phosphate such as tricresyl phosphate, triphenyl phosphate, tributyl phosphate, tris(2-ethylhexyl)phosphate; polyethylene glycol, polypropylene glycol, triethylene glycol, triethylene glycol diacetate, triethylene glycol dipropionate, triethylene glycol diacrylate, tetraethylene glycol, tetraethylene glycol diacetate, tetraethylene glycol diheptanoate, diethyl adipate; a phthalate such as dioctyl phthalate, diundecyl phthalate, dicyclohexyl phthalate, diphenyl phthalate, butyl benzyl phthalate, etc.

For obtaining the photo-sensitive composition having a desired proper property, an additive agent such as an antifoaming agent, a flatting agent, a coloring material, a slipping agent, an adhesion promoter, a thixotropic agent, a sensitizer, a filler, etc., according to demand properly.

Examples and comparative examples of the present disclosure are illustrated as following.

Lactic Oligomer

A reactant, comprising 14.41 g of L-lactide, 3.34 g of 2-hydroxyethyl methacrylate (HEMA), 0.61 g of stannous 2-ethylhexanoate of a catalyst, and 0.02 g of 4-Methoxyphenol (MEHQ) of the stabilizer, is put into a three-opening reaction bottle. The reaction bottle is placed in an oil bath at 100° C., and an air is led thereto. The reactant is stirred at 250 rpm for 12 hours for obtaining the lactic oligomer (PLA-HEMA macromonomer) with the following structure:

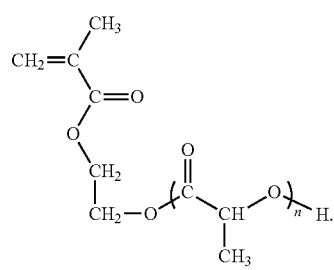

n is an integer with an average of 8.

Binder Agent I 24.4 g of propyleneglycol monomethyl ether acetate of the solvent is put in a four-opening reaction bottle. The temperature of the reaction bottle is heated to 90° C. and nitrogen gas is filled in the reaction bottle. A clear mixture solution, comprising 109.4 g of the lactic oligomer, 18.2 g of itaconic acid, 14.4 g of acrylic acid, 22.7 g of methyl methacrylate, 107.9 g of propyleneglycol monomethyl ether acetate and 0.67 g of N,N'-azobisisobutyronitrile is led into the four-opening reaction bottle. The reaction is continued for 7 hours. After that, the binder agent I is obtained. The solid content of the binder agent I is 55%. The Tg is 51° C. The molecular weight is 20,000. The binder agent I has a chemical structure comprising the following repeating units:

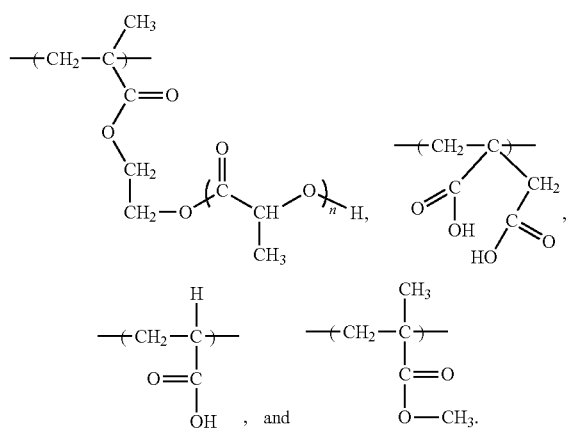

Binder Agent II

The synthesis method for the binder agent II is similar with the synthesis method for the binder agent I except that in the synthesis method for the binder agent II, the propyleneglycol monomethyl ether acetate of the solvent is replaced with 27.6 g of diethyl ketone. In addition, the clear mixture solution comprises 101.7 g of the lactic oligomer, 32.0 g of methacrylic acid, 16.1 g of styrene, 120.0 g of diethyl ketone and 0.26 g of N,N'-azobisisobutyronitrile. The solid content of the formed binder agent II is about 50%. The Tg is about 57° C. The molecular weight is about 32,000. The binder agent II has a chemical structure comprising the following repeating units:

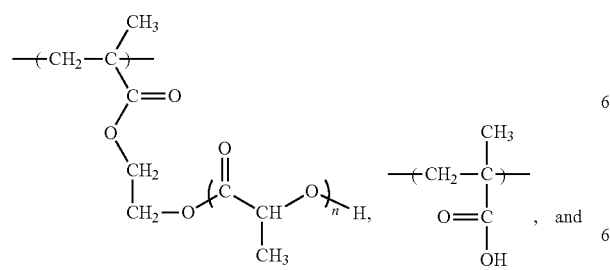

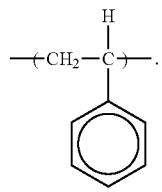

Binder Agent III

The synthesis method for the binder agent III is similar with the synthesis method for the binder agent I except that in the synthesis method for the binder agent III, the weight of the propyleneglycol monomethyl ether acetate is changed to 17.1 g. In addition, the clear mixture solution comprises 83.1 g of the lactic oligomer, 14.8 g of itaconic acid, 36.0 g of methacrylic acid, 15.8 g of styrene, 79.9 g of propyleneglycol monomethyl ether acetate, and 0.011 g of N,N'-azobisisobutyronitrile. The solid content of the formed binder agent III is about 60%. The Tg is about 77° C. The molecular weight is about 49,500. The binder agent III has a chemical structure comprising the following repeating unit:

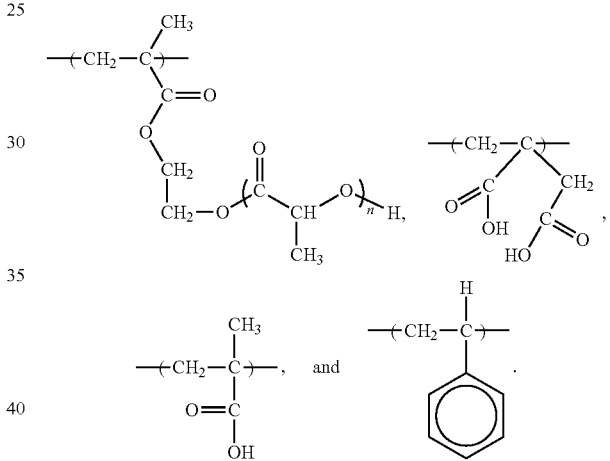

The synthesis method for the binder agent IV is similar with the synthesis method for the binder agent I except that in the synthesis method for the binder agent IV, the propyleneglycol monomethyl ether acetate of the solvent is replaced with 13.3 g of diethyl ketone. In addition, the clear mixture solution comprises 80.3 g of lactic oligomer, 37.9 g of methacrylic acid, 31.3 g of butyl methacrylate, 64.4 g of diethyl ketone and 0.016 g of N,N'-azobisisobutyronitrile. The solid content of the formed binder agent IV is about 65%. The Tg is about 55° C. The molecular weight is about 41,000. The binder agent IV has a chemical structure comprising the following repeating unit:

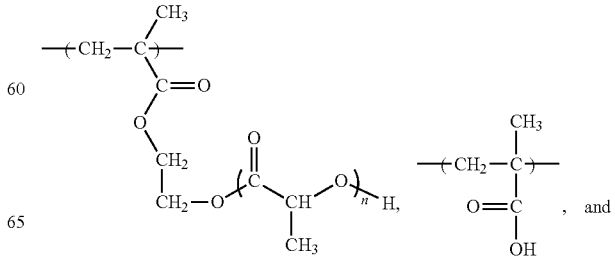

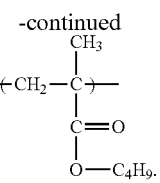

The synthesis method for the binder agent V is similar with the synthesis method for the binder agent I except that in the synthesis method for the binder agent V, the propyleneglycol monomethyl ether acetate of the solvent is replaced with 11.4 g of diethyl ketone. In addition, the clear mixture solution comprises 39.4 g of methacrylic acid, 110.6 g of butyl methacrylate, 64.6 g of diethyl ketone and 0.016 g of N,N'-azobisisobutyronitrile. The solid content of the formed binder agent V is about 65%. The Tg is about 56° C. The molecular weight is about 40,000. The binder agent V has a chemical structure comprising the following repeating units:

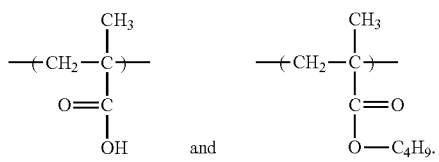

Example 1

A photosensitive composition comprises following compounds is provided.

| Binder agent I | 181.8 |
| --- | --- |
| Trimethylolpropane Triacrylate | 15.0 |
| Dipentaerythritol hexaacrylate | 30.0 |
| 2-Dimethylaminoethyl benzoate | 0.5 |
| Irgacure 369 (Ciba Specialty Chemicals, Pufeng industrial Co., td) | 2.0 |
| Hydroquinone | 0.5 |
| Blue 603 (Kelly corp.) | 1.0 |
| Modaflow 2100 | 1.0 |
| Defoamer DC-1000 (Deuchem Trading Co.) | 2.0 |
| Diethyl ketone | 60.0 |

The above photosensitive composition is stirred and mixed uniformly. After the photosensitive composition is coated onto a PET substrate by a curtain coating, the substrate is dried in a drying oven at 100° C. for 2 minutes. After the photosensitive film is cooled, it is laminated onto a copper foil by a pressing mechanism at 100° C.-120° C. Next, the photosensitive film is exposed by an UV exposure mechanism. The exposing energy is 80 mJ/cm$^2$. The film is developed by a $Na_2CO_{3(aq)}$ of 1.0% for exposing the copper foil. After the substrate is etched by a $CuCl_{2(aq)}$, the photoresist is stripped by a $NaOH_{(aq)}$ of 1%.

Example 2

A photosensitive composition comprises following compounds is provided.

| Binder agent II | 200.0 |
| --- | --- |
| Ethoxylated trimethylolpropane triacrylate | 20.0 |
| Dipentaerythritol pentaacrylate | 20.0 |
| Benzophenone | 3.0 |
| Michler's ketone | 0.5 |
| Hydroquinone | 1.0 |
| Malachite green oxalate | 1.0 |
| Modaflow 2100 | 1.0 |
| Defoamer DC-1000 (Deuchem Trading Co.) | 2.0 |
| Diethyl ketone | 50.0 |

A photosensitive film formed by using the photosensitive composition is formed by a method similar with that of example 1. In addition, a photoresist process is performed to the photosensitive film.

Example 3

A photosensitive composition comprises following compounds is provided.

| Binder agent III | 166.7 |
| --- | --- |
| Aromatic urethane hexaacrylate | 15.0 |
| Trimethylolpropane triacrylate | 35.0 |
| Benzil dimethyl ketal | 2.0 |
| Michler's ketone | 1.0 |
| Hydroquinone | 1.0 |
| Malachite green oxalate | 1.0 |
| Modaflow 2100 | 1.0 |
| Defoamer DC-1000 (Deuchem Trading Co.) | 2.0 |
| Diethyl ketone | 65.0 |

A photosensitive film formed by using the photosensitive composition is formed by a method similar with that of example 1. In addition, a photoresist process is performed to the photosensitive film.

Example 4

A photosensitive composition comprises following compounds is provided.

| Binder agent IV | 153.8 |
| --- | --- |
| Dipentaerythritol pentaacrylate | 35.0 |
| Trimethylolpropane triacrylate | 10.0 |
| Benzophenone | 2.0 |
| Michler's ketone | 0.5 |
| Hydroquinone | 0.5 |
| Blue 603 (Kelly corp.) | 1.0 |
| Modaflow 2100 | 1.0 |
| Defoamer DC-1000 (Deuchem Trading Co.) | 2.0 |
| Diethyl ketone | 80.0 |

A photosensitive film formed by using the photosensitive composition is formed by a method similar with that of example 1. In addition, a photoresist process is performed to the photosensitive film.

Comparative Example

A photosensitive composition comprises following compounds is provided.

| Binder agent V | 153.8 |
| --- | --- |
| Dipentaerythritol pentaacrylate | 35.0 |
| Trimethylolpropane triacrylate | 10.0 |
| Benzophenone | 2.0 |
| Michler's ketone | 0.5 |
| Hydroquinone | 0.5 |

| | |
|---|---|
| Blue 603 (Kelly corp.) | 1.0 |
| Modaflow 2100 | 1.0 |
| Defoamer DC-1000 (Deuchem Trading Co.) | 2.0 |
| Diethyl ketone | 80.0 |

A photosensitive film formed by using the photosensitive composition is formed by a method similar with that of example 1. In addition, a photoresist process is performed to the photosensitive film.

Test Result

Table 1 shows test results of the photoresist films of the examples 1 to 4 and the comparative example. From table 1, it is found that characteristics of photosensitivity, high developing property, high resolution, high adhesion, high corrosion resistance and rapid stripping of the photoresist of example of present disclosure are similar with that of the photoresist film of the comparative example.

TABLE 1 test result of photoresist

| | Example 1 | Example 2 | Example 3 | Example 4 | Comparative example |
|---|---|---|---|---|---|
| photosensitivity (grid number) | 5 | 6 | 5 | 5 | 6 |
| resolution (μm) | 100 | 100 | 100 | 100 | 100 |
| adhesion (μm) | 80 | 80 | 80 | 80 | 80 |
| residue (scum) | None | None | None | None | None |
| stripping time (second) | 27 | 32 | 25 | 34 | 26 |
| etching resistance | OK | OK | OK | OK | OK |

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A photosensitive composition, comprising:
a binder agent having a chemical structure comprising the following repeating units:

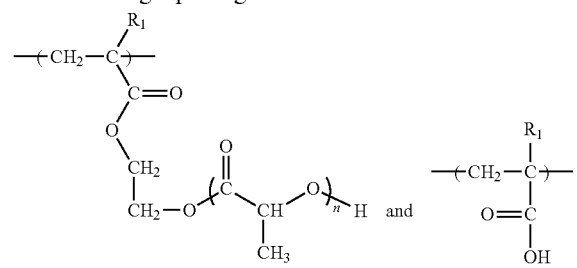

wherein $R_1$ is H or $CH_3$, n is an integer from 2-40;
a photomonomer, wherein the photomonomer has an amount of about 25-95 parts by weight relative to 100 parts by weight of a solid content of the binder agent; and
a photoinitiator, wherein the photo initiator has an amount of about 0.5-15 parts by weight relative to 100 parts by weight of the solid content of the binder agent.

2. The photosensitive composition according to claim 1, wherein the photomonomer comprises dipentaerythritol pentaacrylate, dipentaerythritol hexaacrylate, aromatic urethane hexaacrylate, trimethylolpropane triacrylate, ethoxylated trimethylolpropane triacrylate, trimethylolpropane trimethacrylate, ethoxylated trimethylolpropane trimethacrylate, pentaerythritol triacrylate, pentaerythritol trimethacrylate, pentaerythritol tetraacrylate or pentaerythritol tetramethacrylate.

3. The photosensitive composition according to claim 1, wherein the photoinitiator comprises benzyl dimethyl ketal, 2,4-diethylthioxanthone, isopropylthioxanthone, 2-methyl-1-(4-(methylthio) phenyl)-2-morpholinopropanone-1, or benzophenone.

4. The photosensitive composition according to claim 3, further comprising a sensitizer comprising 2-dimethyl aminoethyl benzoate, ethyl (p-dimethylamino) benzoate, or 4,4'-bis(N,N-dimethylamino)benzophenone, wherein the sensitizer has an amount of about 0.1-5 parts by weight relative to 100 parts by weight of the solid content of the binder agent.

5. The photosensitive composition according to claim 1, wherein the binder agent is formed by polymerizing a binder composition comprising a latic oligomer, a weight ratio of the lactic oligomer to the solid content of the binder agent is about 10%-90%.

6. A photosensitive composition, comprising:
a binder agent, wherein the binder agent has a chemical structure comprising the following repeating units:

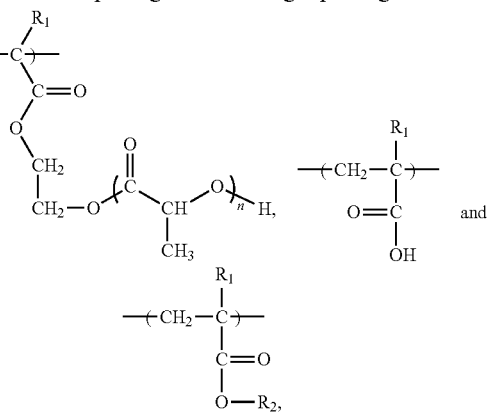

wherein $R_1$ is H or $CH_3$, $R_2$ is an alkyl group with a number of carbons from 1 to 4, n is an integer from 2-40;
a photomonomer, wherein the photomonomer has an amount of about 25-95 parts by weight relative to 100 parts by weight of a solid content of the binder agent; and
a photoinitiator, wherein the photoinitiator has an amount of about 0.5-15 parts by weight relative to 100 parts by weight of the solid content of the binder agent.

7. A photosensitive composition, comprising:
a binder agent having a chemical structure comprising the following repeating units:

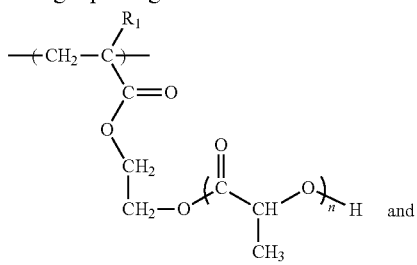

-continued

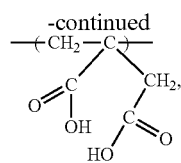

wherein $R_1$ is H or $CH_3$, n is an integer from 2-40;
  a photomonomer, wherein the photomonomer has an amount of about 25-95 parts by weight relative to 100 parts by weight of a solid content of the binder agent; and
  a photoinitiator, wherein the photo initiator has an amount of about 0.5-15 parts by weight relative to 100 parts by weight of the solid content of the binder agent.

8. The photosensitive composition according to claim 7, wherein the binder agent having a chemical structure comprises the following repeating units:

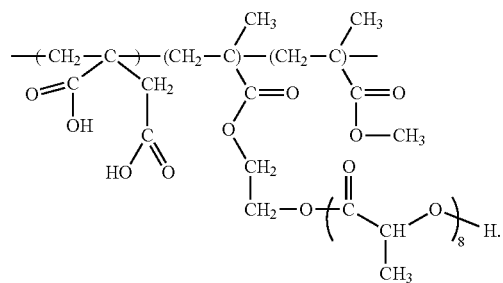

9. A photosensitive composition, comprising:
  a binder agent, wherein the binder agent has a chemical structure comprising the following repeating units:

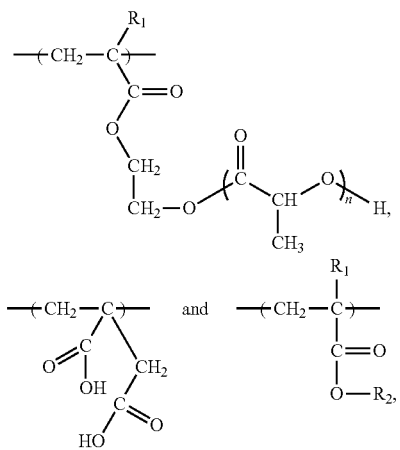

wherein $R_1$ is H or $CH_3$, $R_2$ is an alkyl group with a number of carbons from 1 to 4, n is an integer from 2-40;
  a photomonomer, wherein the photomonomer has an amount of about 25-95 parts by weight relative to 100 parts by weight of a solid content of the binder agent; and
  a photoinitiator, wherein the photo initiator has an amount of about 0.5-15 parts by weight relative to 100 parts by weight of the solid content of the binder agent.

10. The photosensitive composition according to claim 9, wherein the binder agent having a chemical structure comprises the following repeating units:

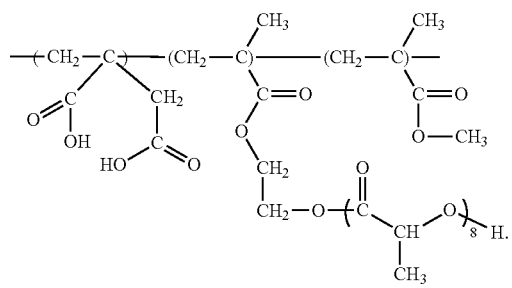

11. A photosensitive composition, comprising:
  a binder agent, wherein the binder agent has a chemical structure comprising the following repeating units:

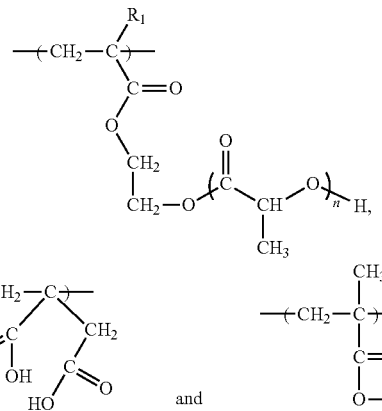

wherein $R_1$ is H or $CH_3$, n is an integer from 2-40;
  a photomonomer, wherein the photomonomer has an amount of about 25-95 parts by weight relative to 100 parts by weight of a solid content of the binder agent; and
  a photoinitiator, wherein the photo initiator has an amount of about 0.5-15 parts by weight relative to 100 parts by weight of the solid content of the binder agent.

12. The photosensitive composition according to claim 11, wherein the binder agent having a chemical structure comprises the following repeating units:

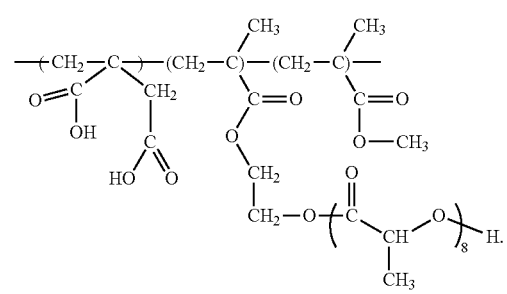

* * * * *